United States Patent
Dabral et al.

(10) Patent No.: US 11,735,526 B2
(45) Date of Patent: Aug. 22, 2023

(54) HIGH DENSITY 3D INTERCONNECT CONFIGURATION

(71) Applicant: Apple Inc., Cupertino, CA (US)

(72) Inventors: Sanjay Dabral, Cupertino, CA (US);
Zhitao Cao, Campbell, CA (US);
Kunzhong Hu, Cupertino, CA (US);
Jun Zhai, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/699,563

(22) Filed: Mar. 21, 2022

(65) Prior Publication Data

US 2022/0285273 A1  Sep. 8, 2022

Related U.S. Application Data

(63) Continuation of application No. 16/783,132, filed on Feb. 5, 2020, now Pat. No. 11,309,246.

(51) Int. Cl.
*H01L 23/528* (2006.01)
*H01L 23/498* (2006.01)
(Continued)

(52) U.S. Cl.
CPC .... *H01L 23/5286* (2013.01); *H01L 23/49816* (2013.01); *H01L 23/5381* (2013.01); *H01L 23/5383* (2013.01); *H01L 23/5386* (2013.01); *H01L 23/5389* (2013.01); *H01L 25/0652* (2013.01); *H05K 1/111* (2013.01);
(Continued)

(58) Field of Classification Search
CPC ........... H01L 23/5286; H01L 23/49816; H01L 23/5381; H01L 23/5383; H01L 23/5386; H01L 25/0652; H01L 23/13; H01L 23/481; H01L 23/498; H01L 23/49822; H01L 23/49827; H01L 23/94838; H01L 23/538; H01L 23/5384; H01L 23/5385;
(Continued)

(56) References Cited

U.S. PATENT DOCUMENTS

| | | |
|---|---|---|
| 5,338,970 A | 8/1994 | Boyle et al. |
| 5,483,421 A | 1/1996 | Gedney et al. |

(Continued)

FOREIGN PATENT DOCUMENTS

| | | |
|---|---|---|
| CN | 106558574 A | 4/2017 |
| CN | 110088897 A | 8/2019 |

(Continued)

OTHER PUBLICATIONS

F.C. Chen et al., "System on Integrated Chips (SoIC™) for 3D Heterogeneous Integration," 2019 IEEE 69th Electronic Components and Technology Conference (ECTC), 6 pages, Research and Development, Taiwan Semiconductor Manufacturing Company, Hsinchu, Taiwan.
(Continued)

*Primary Examiner* — Eduardo A Rodela
(74) *Attorney, Agent, or Firm* — Aikin & Gallant, LLP

(57) ABSTRACT

Electronic package structures and systems are described in which a 3D interconnect structure is integrated into a package redistribution layer and/or chiplet for power and signal delivery to a die. Such structures may significantly improve input output (IO) density and routing quality for signals, while keeping power delivery feasible.

20 Claims, 13 Drawing Sheets

(51) Int. Cl.
*H01L 23/538* (2006.01)
*H01L 25/065* (2023.01)
*H05K 1/11* (2006.01)
*H05K 1/18* (2006.01)
*H01L 23/00* (2006.01)

(52) U.S. Cl.
CPC .............. *H05K 1/181* (2013.01); *H01L 24/16* (2013.01); *H01L 2224/16225* (2013.01); *H05K 2201/10378* (2013.01); *H05K 2201/10734* (2013.01)

(58) Field of Classification Search
CPC ... H01L 23/5389; H01L 25/162; H05K 1/111; H05K 1/181
See application file for complete search history.

(56) References Cited

U.S. PATENT DOCUMENTS

| | | | |
|---|---|---|---|
| 6,137,161 | A | 10/2000 | Gilliland et al. |
| 6,198,635 | B1 | 3/2001 | Shenoy et al. |
| 7,847,404 | B1 | 12/2010 | Schwegler et al. |
| 8,405,226 | B2* | 3/2013 | Knickerbocker ... H01L 23/5286 |
| | | | 257/777 |
| 8,610,260 | B2 | 12/2013 | Crisp et al. |
| 8,994,176 | B2 | 3/2015 | Wu et al. |
| 9,129,958 | B2 | 9/2015 | Mallik et al. |
| 9,167,694 | B2 | 10/2015 | Sundaram et al. |
| 9,331,062 | B1 | 5/2016 | Lane et al. |
| 9,607,680 | B2 | 3/2017 | Dabral |
| RE46,666 | E | 1/2018 | Lee |
| 10,056,327 | B2* | 8/2018 | Zhai ............... H01L 23/5383 |
| 10,057,976 | B1 | 8/2018 | Shi et al. |
| 10,217,708 | B1 | 2/2019 | Dabral et al. |
| 10,311,938 | B2 | 6/2019 | Dabral |
| 10,433,425 | B1 | 10/2019 | Liu et al. |
| 10,535,608 | B1 | 1/2020 | Rubin et al. |
| 11,217,535 | B2* | 1/2022 | Elsherbini ........... H01L 23/3675 |
| 11,309,246 | B2 | 4/2022 | Dabral et al. |
| 2002/0088977 | A1 | 7/2002 | Mori et al. |
| 2008/0247116 | A1 | 10/2008 | Kawano et al. |
| 2009/0085217 | A1 | 4/2009 | Knickerbocker et al. |
| 2012/0125677 | A1* | 5/2012 | Choi ................. H05K 1/0224 |
| | | | 174/262 |
| 2012/0168934 | A1 | 7/2012 | Yadav et al. |
| 2014/0292399 | A1 | 10/2014 | Kashiwakura |
| 2015/0206855 | A1 | 7/2015 | Lin |
| 2015/0371951 | A1 | 12/2015 | Yeh et al. |
| 2016/0049371 | A1 | 2/2016 | Lee et al. |
| 2017/0062383 | A1 | 3/2017 | Yee et al. |
| 2017/0083067 | A1* | 3/2017 | Ganor ..................... G06F 1/26 |
| 2017/0092579 | A1* | 3/2017 | Collier ............... H01L 21/4853 |
| 2017/0221848 | A1 | 8/2017 | Iguchi et al. |
| 2017/0236809 | A1 | 8/2017 | Trimberger et al. |
| 2017/0350933 | A1 | 12/2017 | Uematsu et al. |
| 2017/0365558 | A1 | 12/2017 | Oh et al. |
| 2018/0102311 | A1 | 4/2018 | Shih |
| 2018/0331094 | A1 | 11/2018 | DeLaCruz et al. |
| 2018/0358298 | A1 | 12/2018 | Zhai et al. |
| 2019/0035729 | A1 | 1/2019 | Aoki et al. |
| 2019/0115292 | A1 | 4/2019 | Morrison et al. |
| 2019/0122993 | A1 | 4/2019 | Kim et al. |
| 2019/0198462 | A1 | 6/2019 | Nakagawa et al. |
| 2019/0273044 | A1 | 9/2019 | Fu et al. |
| 2019/0304899 | A1 | 10/2019 | Park et al. |
| 2020/0105653 | A1* | 4/2020 | Elsherbini ............... H01L 24/03 |
| 2021/0159180 | A1 | 5/2021 | Zhai et al. |
| 2022/0238339 | A1 | 7/2022 | DeLaCruz et al. |

FOREIGN PATENT DOCUMENTS

| | | |
|---|---|---|
| CN | 110692127 A | 1/2020 |
| KR | 20170075125 A | 7/2017 |
| KR | 20170137140 A | 12/2017 |
| KR | 20180034498 A | 4/2018 |
| TW | 201447664 A | 12/2014 |
| TW | 201530734 A | 8/2015 |
| TW | 201903979 A | 1/2019 |
| WO | 2019079625 A1 | 4/2019 |

OTHER PUBLICATIONS

PCT/US2021/015441, "Notification of Transmittal of the International Search Report and the Written Opinion of the Intentional Searching Authority, or the Declaration", dated Jun. 15, 2021, 6 pages.

* cited by examiner

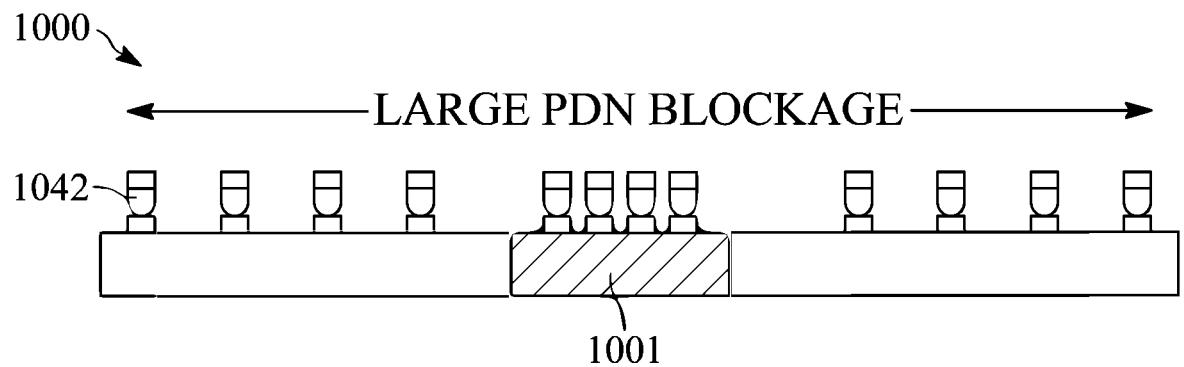
*FIG. 10A*
SMALL PDN BLOCKAGE
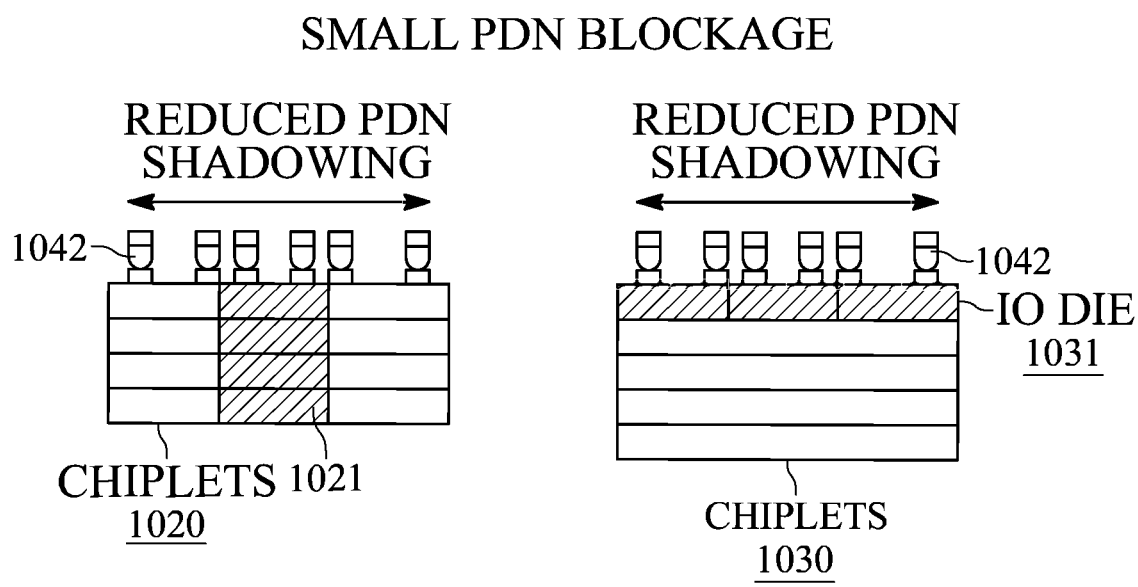
*FIG. 10B*  *FIG. 10C*

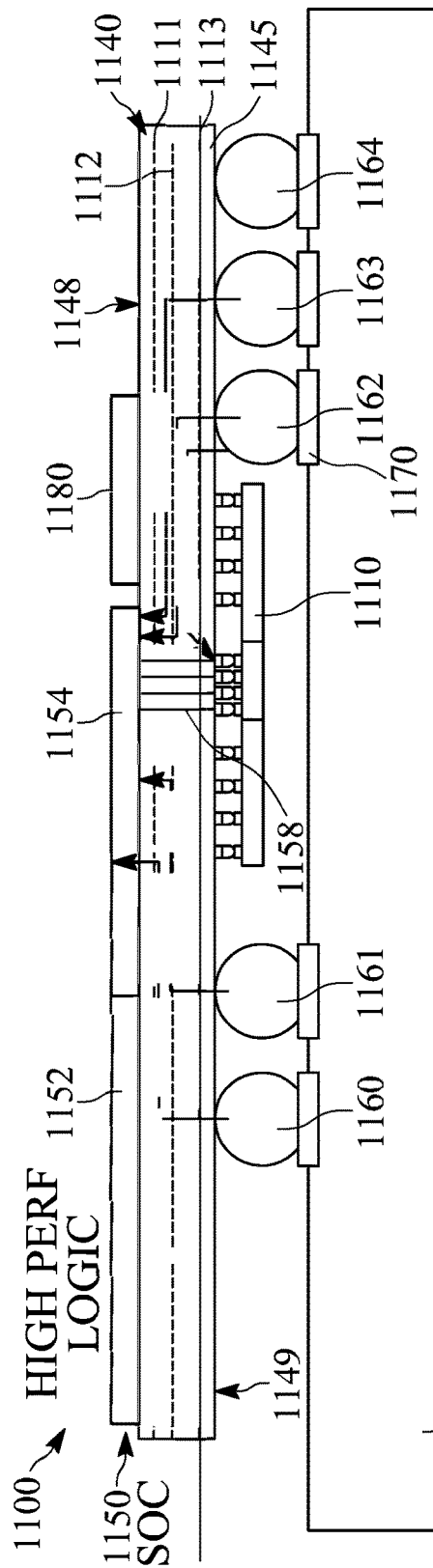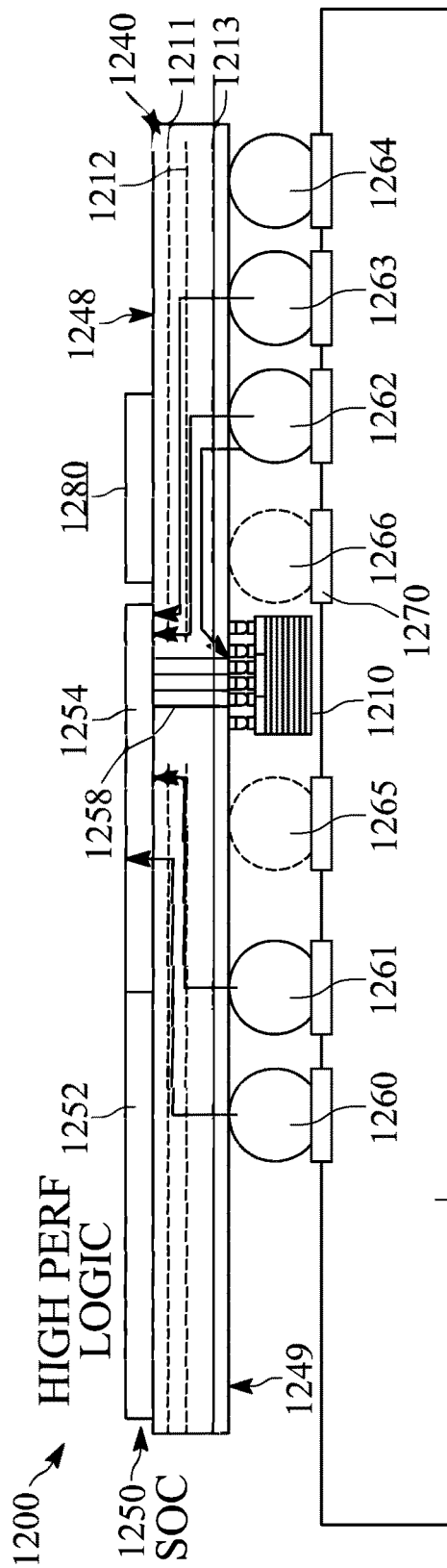

HIGH DENSITY 3D INTERCONNECT CONFIGURATION

RELATED APPLICATIONS

The present application is a continuation of co-pending U.S. patent application Ser. No. 16/783,132, filed Feb. 5, 2020, which is incorporated herein by reference in its entirety.

BACKGROUND

Field

Embodiments described herein relate to semiconductor packaging, and more specifically to a semiconductor package including a high density 3D interconnection.

Background Information

The current market demand for portable and mobile electronic devices such as mobile phones, personal digital assistants (PDAs), digital cameras, portable players, gaming, and other mobile devices requires the integration of more performance and features into increasingly smaller spaces. As a result, the input/output density of dies and number of dies integrated within a single package have increased significantly. Various 2.5D and 3D packaging solutions in particular have been proposed as multi-die packaging solutions to connect adjacent die within a single package.

SUMMARY

In accordance with various aspects of the subject disclosure, an electronic package includes a redistribution layer (RDL) and a die on the RDL. The RDL includes a 3D interconnect structure for power and signal delivery to the die. The RDL improves input output (IO) density and routing quality for signal paths, while keeping power delivery feasible.

In accordance with other aspects of the subject disclosure, an electronic system includes a circuit board. The circuit board includes a negative power supply (Vss) landing pad, a positive power supply (Vdd) landing pad, and a plurality of signal landing pads. An electronic package is mounted on the circuit board and bonded to the Vss landing pad, the Vdd landing pad, and the plurality of signal landing pads. The electronic package includes a redistribution layer (RDL), a die on the RDL, and a 3D interconnect structure for Vss, Vdd, and signal delivery to the die.

BRIEF DESCRIPTION OF THE DRAWINGS

FIG. 10A is a cross-sectional side view illustration of a chiplet in accordance with an embodiment.

FIG. 10B is a cross-sectional side view illustration of stacked chiplets in accordance with an embodiment.

FIG. 10C is a cross-sectional side view illustration of stacked chiplets in accordance with an embodiment.

FIG. 11 is a cross-sectional side view illustration of a multi-component package including a chiplet in accordance with an embodiment.

FIG. 12 is a cross-sectional side view illustration of a multi-component package including a stacked chiplet in accordance with an embodiment.

DETAILED DESCRIPTION

Figure 1:
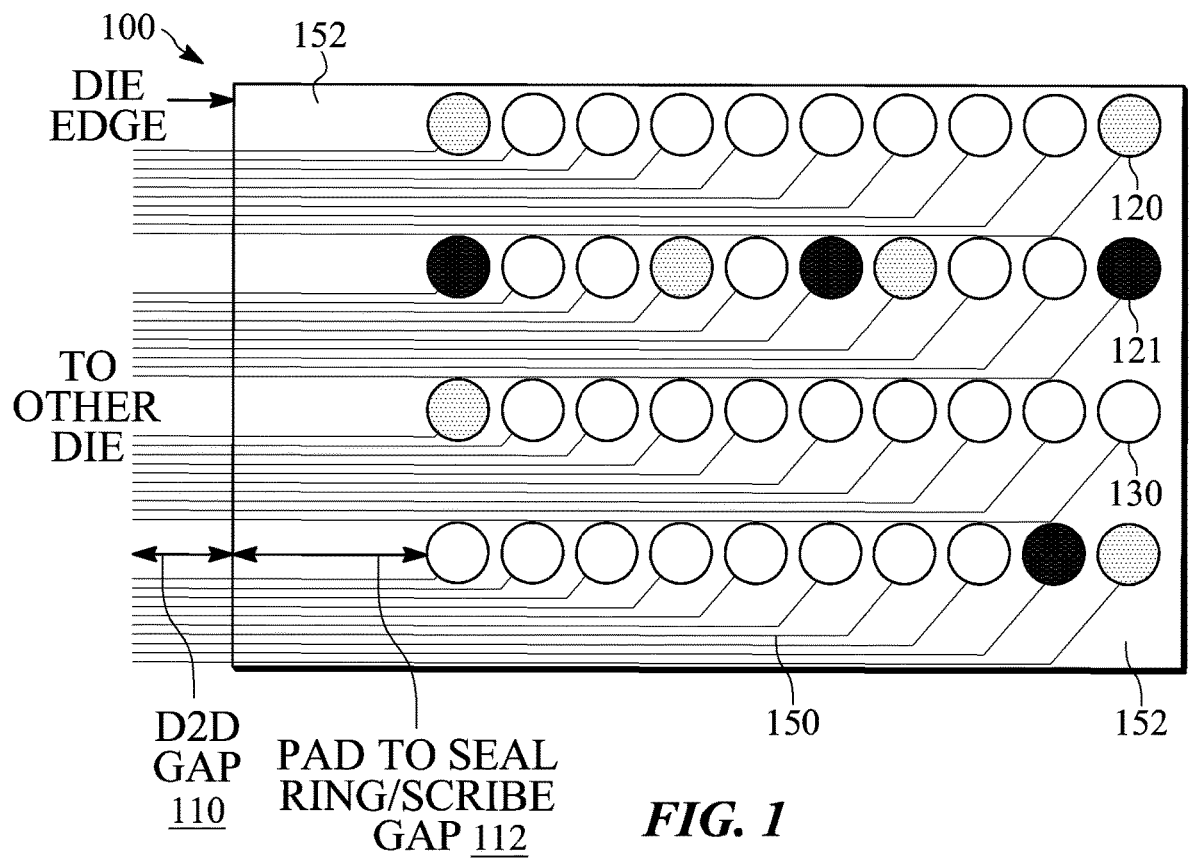
FIG. 1 illustrates a top down 2D view of a 2D interconnect configuration of a package.

Embodiments describe semiconductor packages with three-dimensional (3D) interconnect structures for power delivery between multiple components. The 3D interconnect structures may be used to deliver power between a circuit board and package component (e.g. die), and/or between components within the package. The 3D interconnect structures may be included within a package redistribution layer (RDL), package chiplet, and combinations thereof.

The 3D interconnect structures in accordance with embodiments may include power bars, power planes, meshes, stacked vias and other 3D interconnect structures for power and signal delivery to a die. Such 3D interconnect configurations may allow for a lower cost and higher input output (IO) density compared to 2D interconnect configurations in which package routing to chip contact pads can be constrained by lateral wiring density and pad size. In an embodiment, power bars within a 3D interconnect structure are aligned with die pads/bumps. Wide power bars may provide ample metal cross-section for small voltage drops (current resistance (IR)) and sufficient electromigration margin. The arrangement of power bars may additionally reduce the burden of lateral wiring density, and allow grouping of specific contact pads/bumps. The 3D interconnect configurations in accordance with embodiments may reduce on-chip routing to electronic components (e.g., SoC) and this saves power, area, and communication latency.

The 3D interconnect configurations in accordance with embodiments may incorporate numerous types of dies (e.g., power management integrated circuit (PMIC), integrated voltage regulator (IVR), graphics processing unit (GPU), active bridges to other chips, IO chiplets, etc.) to be connected. The 3D interconnect configuration reduces a package area and this reduces package cost and reduces system volume for a given product. In an embodiment, the semiconductor package includes a system on chip (SoC) die that includes a high performance logic area and a low performance logic area. The 3D interconnect structure can be located at least partially under the low performance logic area to avoid interference and degradation that could otherwise occur if the 3D interconnect structure were aligned under the high performance logic area having higher power density and higher temperature regions. In an embodiment, the 3D interconnect is located substantially directly under the low performance logic area.

Chiplets may optionally be included in the semiconductor package structure in accordance with embodiments, and the chiplets may optionally include 3D interconnect routing or offload a portion of the 3D interconnect routing from the package RDL. In one aspect, the chiplet includes fine pitch component-to-component routing while the optional package RDL includes coarser pitch fan out routing for the package. In this manner, the cost and complexity of including fine pitch routing within the RDL can be avoided. Additionally, it is not necessary to include an interposer with through silicon vias (TSVs) within the package.

In another aspect, embodiments describe chiplet configurations which may optionally include an integrated passive device, such as resistor, inductor, capacitor (e.g., metal-insulator-metal (MIM) capacitors, trench capacitors, etc.). Various modifications and variations for integrating a chiplet within a package are contemplated in accordance with embodiments. The packages may additionally include a backside RDL, combinations of the same or different components, and addition of a heat spreader, stiffener ring, or embedded active die.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "to", "between" and "on" as used herein may refer to a relative position of one layer with respect to other layers. One layer "on" another layer or bonded "to" or in "contact" with another layer may be directly in contact with the other layer or may have one or more intervening layers. One layer "between" layers may be directly in contact with the layers or may have one or more intervening layers.

It has been observed that multi-component packages having a side by side die configuration that use fine line metal wiring layers have limitations. FIG. 1 illustrates a top down 2D view of a 2D interconnect configuration of a such a package 100. In particular, FIG. 1 illustrates lateral interconnect routing to a single die in a side-by-side die arrangement. As shown, a die to die (D2D) gap 110 is needed between dies 152 (e.g., CPU die, memory die, etc.). A pad to seal ring/scribe gap 112 can also be needed. Metal routing lines 150 and pads (e.g., high/positive supply (Vdd) contact pads 120, ground/low/negative supply (Vss) contact pads 121, signal contact pads 130) need horizontal space and width in a package as illustrated in FIG. 1 and this lowers input output (IO) density. Routing and vias also interfere with each other and this limits wiring density. Effective via pitch also increases for the 2D interconnect configuration. Additional package area is also needed for any additional components (e.g., memory, logic, etc.) being attached to the package. FIG. 1 also illustrates peripheral blockage with metal routing lines 150 that prevent access to pads for other purposes (e.g., general-purpose input/output (GPIO), Power, etc.). The side by side die configuration causes power delivery issues.

Figure 2:
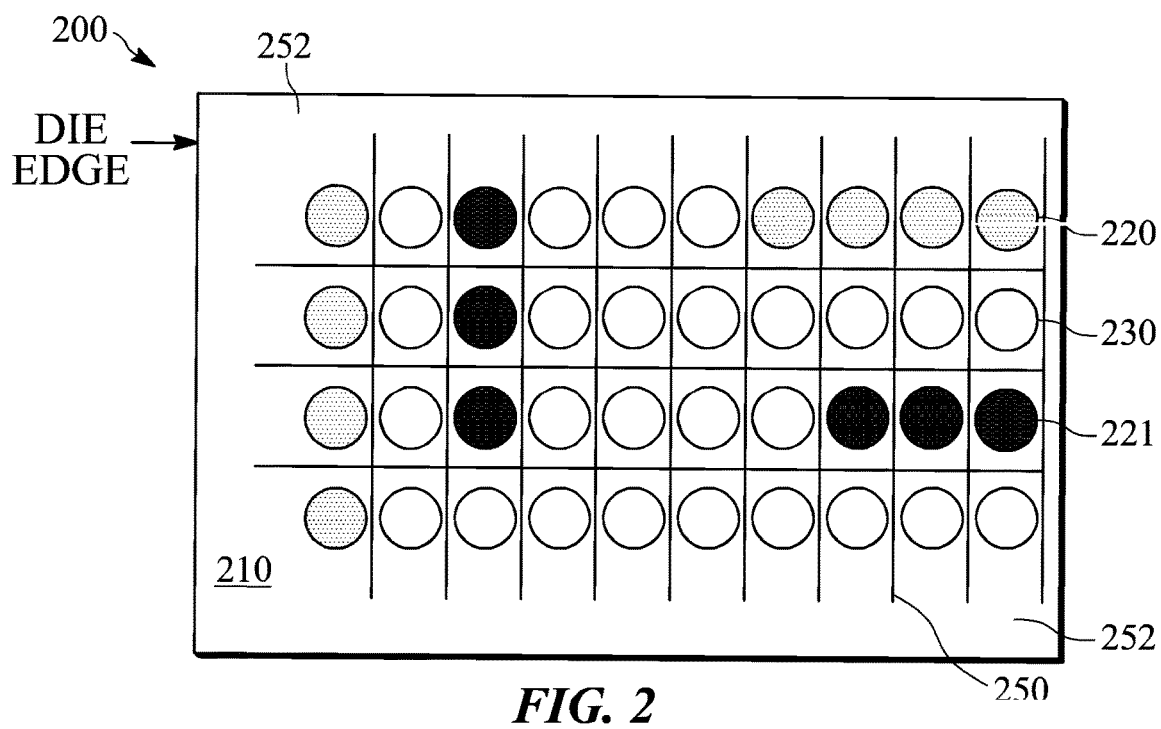
FIG. 2 illustrates a top down 2D view of a 3D interconnect configuration of a multi-component organic package in accordance with embodiments.

FIG. 2 illustrates a top down 2D view of a 3D interconnect configuration of a multi-component (e.g., multi-die, chip) organic package in accordance with embodiments. The package 200 includes at least one component 252 (e.g., system on chip (SoC), die) and 3D interconnect structure for power delivery. Metal routing lines 250 in the 3D interconnect structure can be routed primarily vertically to improve IO density (e.g., 1.5 to 2×) compared to the 2D interconnect configuration of FIG. 1. Additionally, the metal 3D vertical routing does not block peripheral access to the die 252 to the same extent as the 2D interconnect configuration of FIG. 1. Conductive lines 250 that connect to contact pads (e.g., Vdd contact pads 220, ground contact pads 221 (e.g., Vss), and signal contact pads 230) can be included in the package RDL and/or package chiplet as will be described in further detail in the following description.

The 3D interconnect configuration of a multi-component (e.g., multi-die, SoC, GPU die, CPU die, logic die) package in accordance with embodiments may have a low cost based on an organic package, dense IO, and reduced routing. This 3D interconnect configuration can be applied to numerous die types (e.g., memory, logic partitions, integrated voltage regulator, IO, etc.). These die types can also be used as a bridge between multiple components.

The higher IO density of the 3D interconnect configuration lowers link speed between electronic components, to the degree serialization is eliminated, thereby reducing memory IO (e.g., DRAM) area and cost. Reducing on-chip routing (e.g., SoC, memory, cache) saves power, area, and latency.

The 3D interconnect configuration improves interconnect performance due to less routing length (e.g., vertical routing can be shorter than lateral routing), less capacitive load, and lower cross talk. Power delivery can be improved with a decoupling capacitor close to memory or in memory. In accordance with embodiments, a component may be attached using a suitable technique such as flip chip bonding and use of conductive bumps (e.g., solder, micro-bumps). It is to be appreciated that component attachment may also be performed at the wafer scale, including a large number of components. These components can be the same type of die or package. For example, they may both be a logic die or package (e.g. CPU, GPU, SoC, etc.) or memory die or package. In an embodiment, multiple components may be different types of die or packages, or a combination of die and package. In an embodiment, a first component is a CPU die or package, while the second component is a GPU die or package.

A chiplet in accordance with embodiments may include only routing, or additional functionality such as an integrated circuit block. A chiplet can be a reusable intellectual property (IP) block that can provide different circuit functionality (e.g., memory, logic, power management unit (PMU), integrated voltage regulator). Chiplet configurations may optionally include an integrated passive device, such as a resistor, inductor, capacitor, etc. Various modifications and variations for integrating a chiplet within a package are contemplated in accordance with embodiments.

Figure 3A:
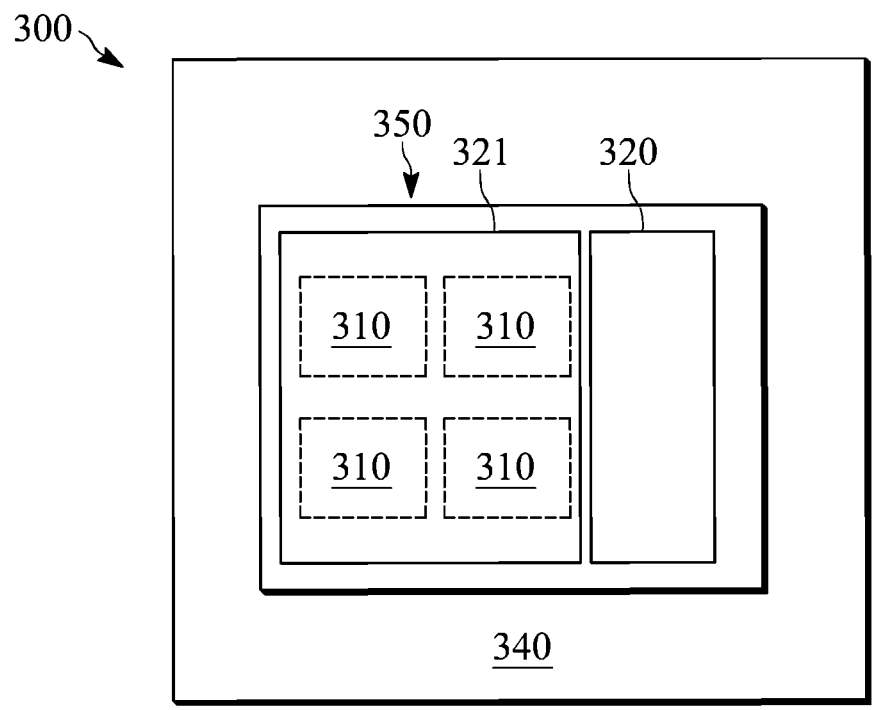
FIG. 3A is a top down 2D view of a multi-component package including a chiplet in accordance with an embodiment.
Figure 3B:
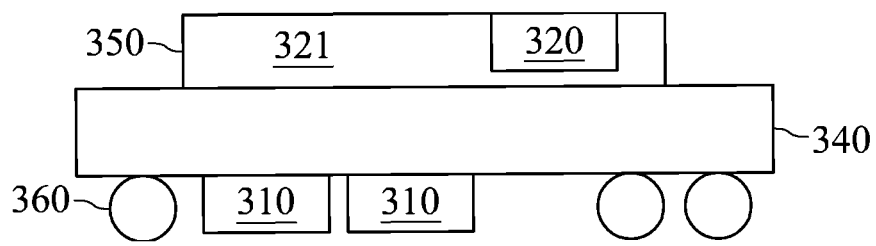
FIG. 3B is a cross-sectional side view illustration of a multi-component package including a chiplet in accordance with an embodiment.
Figure 3C:
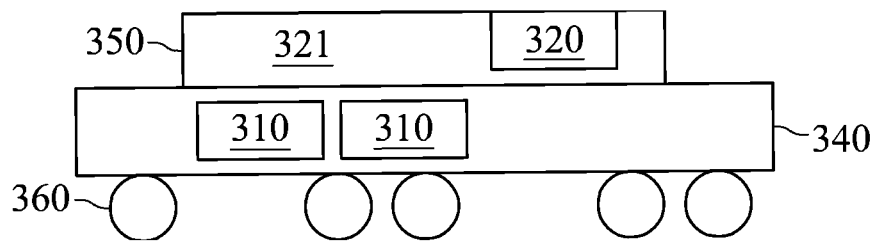
FIG. 3C is a cross-sectional side view illustration of a multi-component package including a chiplet in accordance with an embodiment.

FIG. 3A-3C illustrate different multi-component packages 300 in accordance with embodiments including both one or more die 350 and one or more chiplets 310. Referring now to FIG. 3A, a top down 2D view is provided of such a multi-component package. As shown, the package 300 may include one or more chiplets 310 (e.g., memory, cache, integrated passive device, etc.) one or more dies 350, and a package RDL 340. The die 350 (e.g., SoC) includes the high performance logic 320 (e.g., CPU, GPU, Engines) and low performance logic 321. The chiplet 310 can be positioned below or underneath the low performance logic 321. In one example, the chiplet has a bump pitch of 15-40 microns. The package RDL 340 and/or chiplet(s) 310 in accordance with embodiments can include 3D interconnects (e.g., vertical pillars, stacked vias, etc.). In some specific implementations the 3D interconnects can be configured as power bars, power planes, meshes, and other structures.

Referring now to FIGS. 3B-3C, cross-sectional side view illustrations are provided of a multi-component package in accordance with an embodiment. As shown in FIG. 3B, the chiplets 310 can be attached or mounted to an underside of the redistribution layer 340 and laterally adjacent to the plurality of conductive bumps 360. As shown in FIG. 3C, the chiplets 310 can be embedded in the package RDL 340.

Figure 4A:
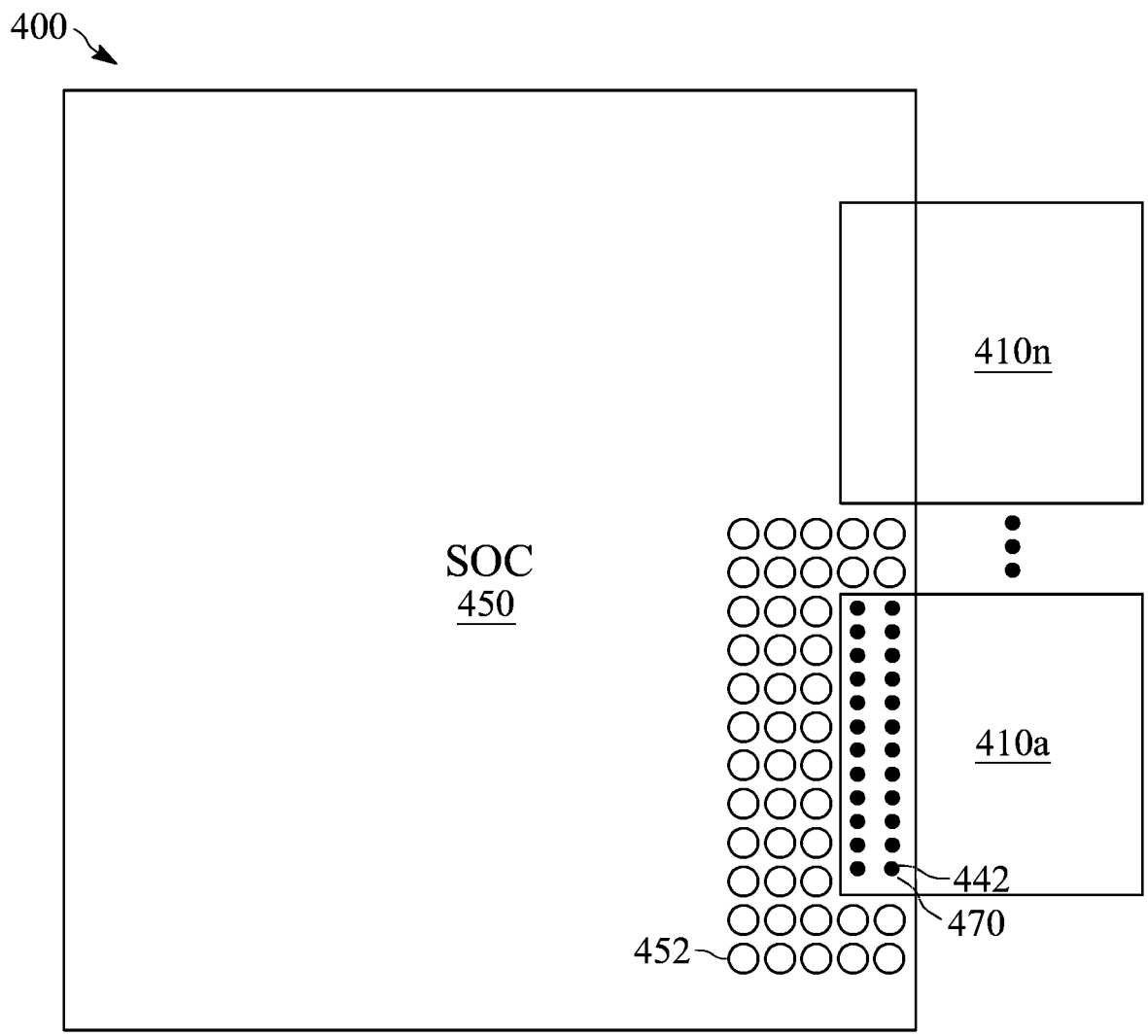
FIG. 4A is a top down 2D view of a multi-component package including a chiplet in accordance with an embodiment.
Figure 4B:
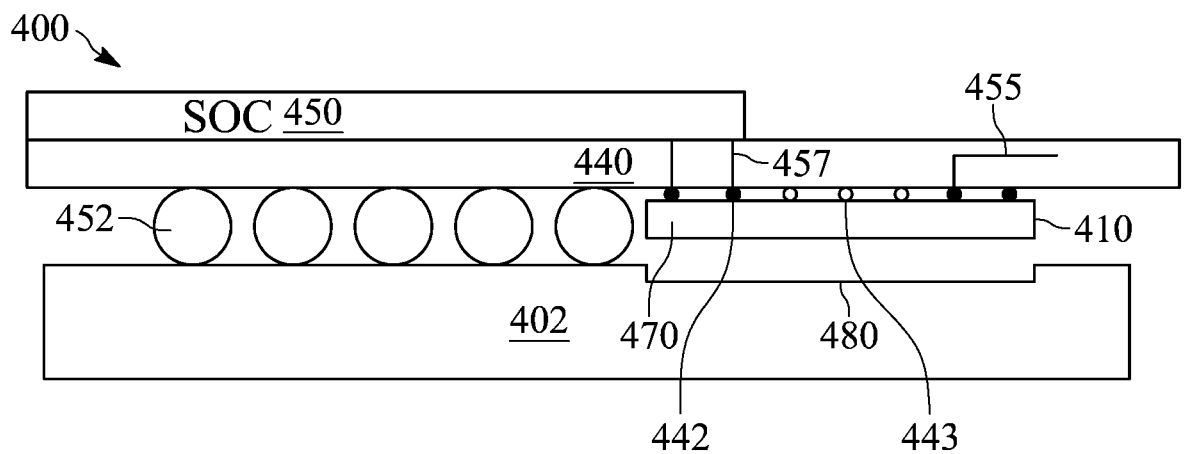
FIG. 4B is a cross-sectional side view illustration of a multi-component package including a chiplet in accordance with an embodiment.

Referring now to FIG. 4A, a top down 2D view is provided of a multi-component package including a chiplet in accordance with an embodiment. As shown, the package 400 may include chiplets 410a . . . 410n (e.g., memory, cache, integrated passive device, etc.), die 450 (e.g., SoC), and a plurality of conductive bumps 452 (e.g. solder bumps, C4). Each chiplet can be laterally offset from the die 450 and each chiplet can include an input output (IO) region 470 that is positioned directly below or underneath the die 450. As used herein, directly below or underneath is understood similarly as shown in FIG. 4A as including at least a partial or full vertical overlap. The micro-bumps 442 and 443 and 3D interconnects 457 of FIG. 4B provides a vertical 3D interconnect between the die 450 and the chiplet 410. It is to be appreciated that while 3D interconnects 457 are illustrated as vertical lines between shadows of the die 450 and chiplet 410, this is not strictly required. The 3D interconnect configurations may additionally have lateral components outside of the shadows, for example, in bar, mesh, plane configurations, etc. Thus, the 3D interconnects 457 can be wholly within the shadows and also span laterally outside of the shadow of either the die 450 or chiplet 410, for example, for electrical connection to circuit board 402 (e.g. with conductive bump 452).

Referring now to FIG. 4B, a cross-sectional side view illustration is provided of a multi-component package including a chiplet in accordance with an embodiment. The chiplet 410 can be positioned partially below or underneath the SoC 450. In one example, the chiplet 410 is surface mounted with micro-bumps 442 to the redistribution layer (RDL) 440. In some embodiments, one or more top metal layers on the circuit board 402 (e.g., main logic board) may have portions removed to form cavity 480 to allow clearance for the chiplet 410. The redistribution line 455 electrically connects the chiplet 410 to another component (e.g., memory) that can optionally be laterally adjacent to die 450 on top of the package RDL 440, or located elsewhere within the package 400 or on a circuit board 402 outside of the package 400. The 3D interconnects 457 provide vertical connection between the die 450 and chiplet 410. The bumps 452 provide a connection between the RDL 440 and a circuit board 402.

The RDL 440 may have one or more redistribution lines (e.g. 455) and 3D interconnects (e.g. 457) and passivation layers. The material of the redistribution lines and the 3D interconnects can be formed from a metallic material such as: copper (Cu); titanium (Ti); nickel (Ni); gold (Au); a combination of at least one of Ti, Ni, Au, or Cu; or other suitable metals, alloys, or combinations of metals and/or alloys. A passivation layer can be any suitable insulating materials such as an oxide, or polymer (e.g. polyimide). In an embodiment, the RDL 440 can include contact pads formed to contact bumps or micro-bumps. Redistribution lines and 3D interconnects may be formed using a suitable technique such as plating or sputtering, followed by etching, etc. Multiple redistribution lines, 3D interconnects and passivation layers can be formed within RDL 440 using a sequence of deposition and patterning.

The 3D interconnect structures in accordance with embodiments (e.g., including power bars, power planes, meshes, stacked vias and other 3D interconnect structures) may reduce routing length to electronic components (e.g., SoC) allowing for lower power being needed, a reduction in cross-talk between components, interconnect noise, line loss, and capacitance. Such a reduction in routing length is illustrated in top down 2D view illustrations of FIGS. 5-6 that illustrating routing paths for 2D side by side and 3D interconnect configurations, respectively. These paths consist of both on-chip and off-chip components.

Figure 5:
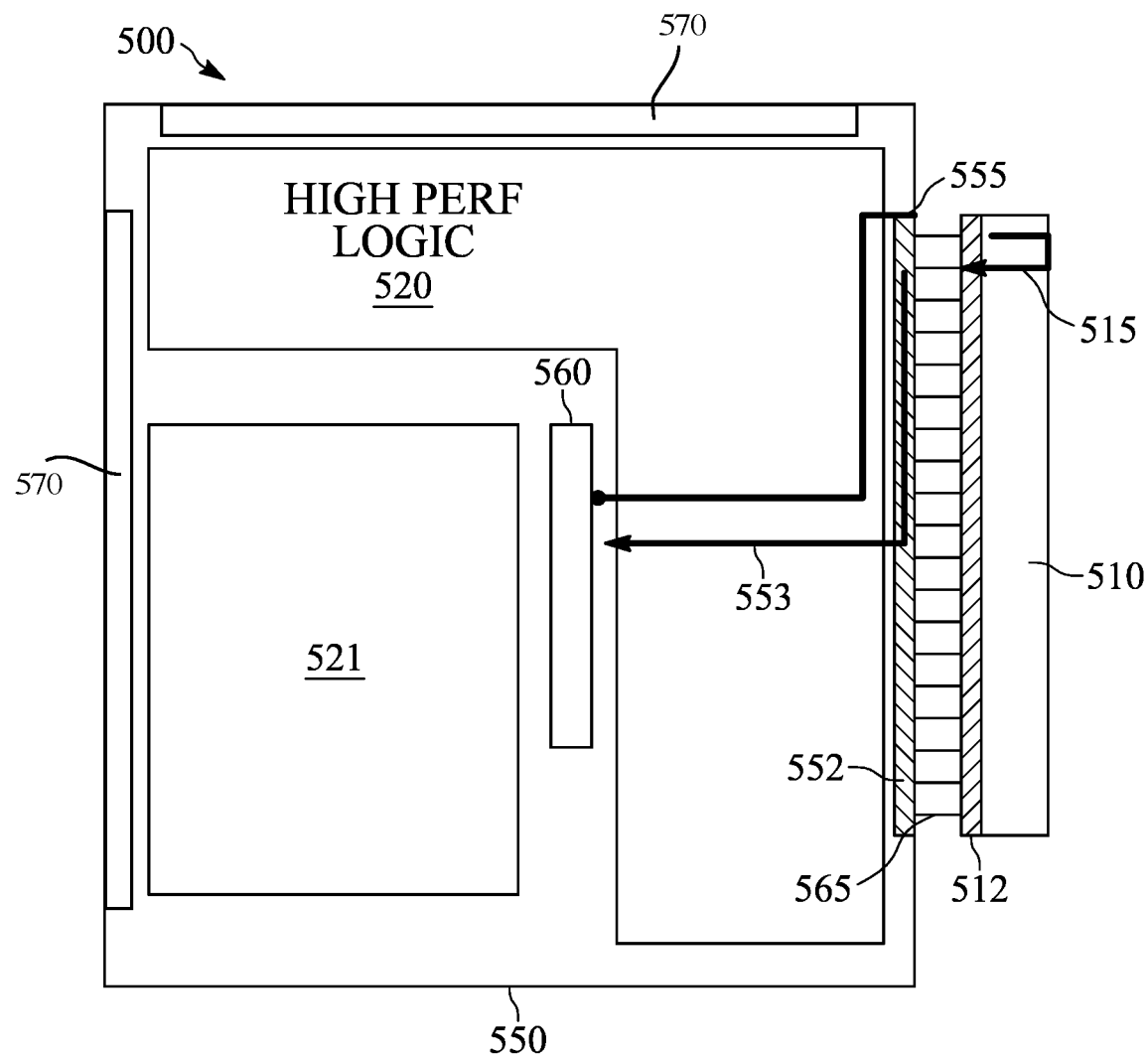
FIG. 5 is a top down 2D view of a multi-component package with a 2D side by side configuration.
Figure 6:
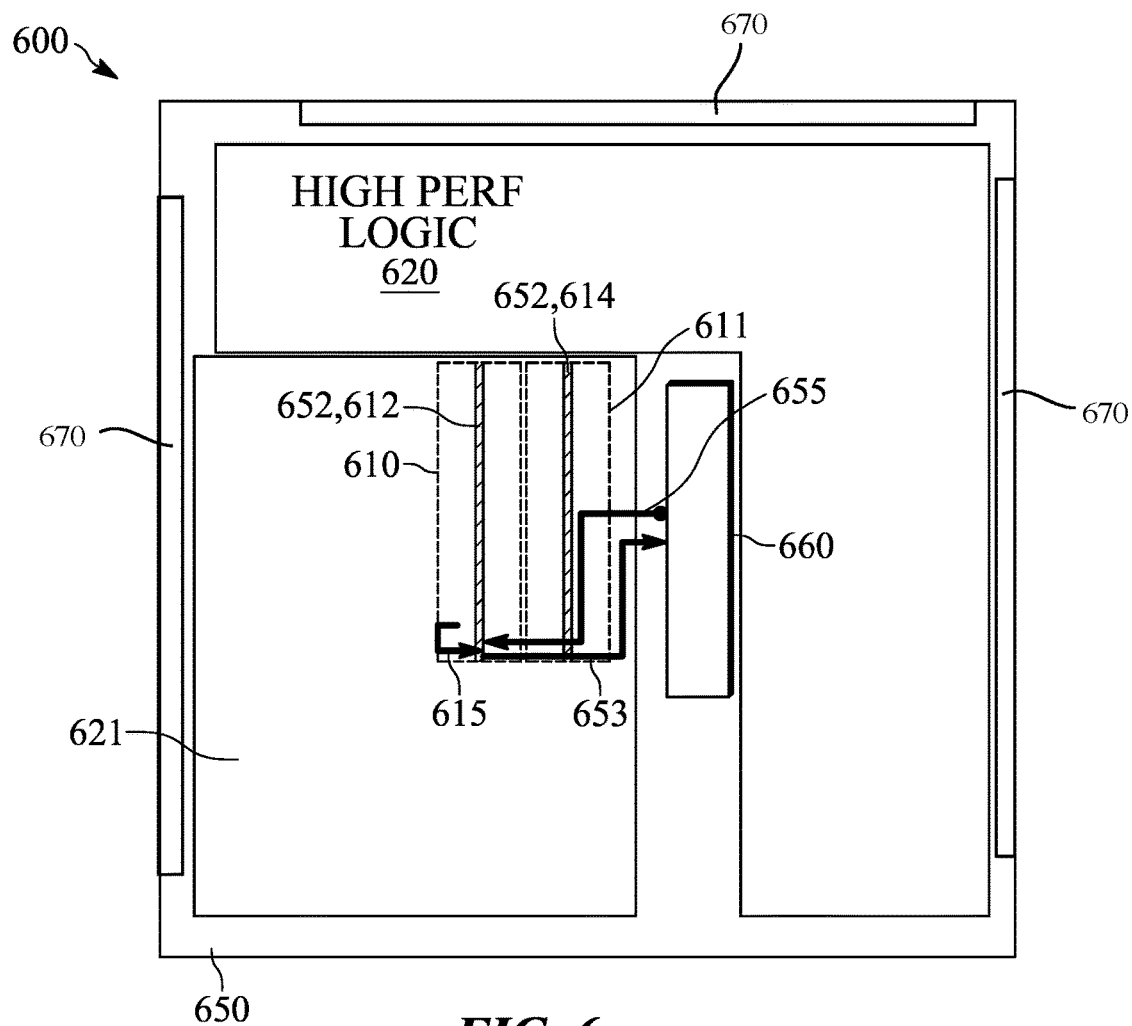
FIG. 6 is a top down 2D view of a multi-component package with a 3D interconnect configuration including a chiplet in accordance with embodiments.

Referring now to FIG. 5, a top down 2D view is provided of a multi-component package with a 2D side by side configuration. As shown, the package 500 includes die 550 (e.g., SoC) that includes a controller 560, IO region 552, high performance logic 520, and low performance logic 521. The controller 560 may be separate or included with the low performance logic 521. A second component 510 (e.g., memory, die, chiplet) having IO region 512 is laterally adjacent and external from the die 550, which results in a long die routing 553 and 555, and a long component routing 515 in comparison to routing as illustrated in FIG. 6 for a 3D interconnect configuration. Redistribution lines 565 electrically provide lateral connections between the IO region 512 and the IO region 552. For example, redistribution lines 565 may be contained within the package RDL. The side by side configuration results in blockage of routing to IO region 552 of the die 550 due to component 510. Due to the side by side configuration, the die 500 has edge availability on only two sides for IO region 570 (e.g., GPIO region, high speed input output (HSIO) region).

FIG. 6 illustrates a top down 2D view of a multi-component package with a 3D interconnect configuration including a chiplet in accordance with embodiments. As shown, the package 600 includes a die 650 (e.g., SoC) having high performance logic 620 and low performance logic 621. The chiplets 610 and 611 are below or underneath from the die 650, which results in reduced die routing (e.g., routing 653 from IO region 612 of chiplet 610 to controller 660, routing 655 from controller 660 to IO region 612 of chiplet 610) and also reduced chiplet routing (e.g., routing 615 from chiplet 610 to IO region 612) compared to routing in FIG. 5. Chiplet 611 includes IO region 614, and similar reduced routing length. The 3D interconnect configuration with the chiplets 610 and 611 being aligned vertically with the die 650 can reduce blockage of routing to peripheral regions of the die 650 (e.g., SoC). Due to the 3D interconnect configuration, the die 650 has edge availability on three sides for IO region 670 (e.g., GPIO region, HSIO region). Total routing length can be reduced as a result of reduced lateral routing length within the package RDL, and reduced lateral die routing 653 length and chiplet routing 615 length.

In one example, high performance logic (e.g., CPU, GPU) has a current density greater than low performance logic. High performance logic may have a current density that is 2-4 times greater than a current density of low performance logic. In another example, high performance logic has a current density of 1-5 Amps/mm$^2$. In another example, high performance logic (e.g., CPU, GPU, computing Engine) has a power density of 1-10 Watts/mm$^2$ while low performance logic has a power density less than or equal to 0.5 Watts/mm$^2$. In some embodiments, power density corresponds to a physical density of metal routing over a given area. For example, a high power density region includes denser metal routing and a low power density region includes less dense metal routing. In some embodiments, power density corresponds to a duration of circuitry on-time over a given area. For example, a high power density region includes a set of circuitry maintained in an active or "on" state for a first period of time and a low power density region includes a set of circuitry maintained in an active or "on" state for a second period of time, which is shorter in duration than the first period of time. In some embodiments, power density corresponds to a particular operating voltage for circuits in a particular region. For example, a high power density region includes circuitry operating on a first power rail and a low power density region includes circuitry operating on a second power rail. In an embodiment, the first and second power rails operate at different voltages. For example, the second power rail may operate at a lower operating voltage than the first power rail. Chiplets can be aligned under low performance logic to avoid interference and degradation of the power delivery, as well as accumulated heat load. If chiplets were to be aligned under high performance logic having high power density and high temperature regions, then this may possibly result in degraded SoC performance.

Figure 7:
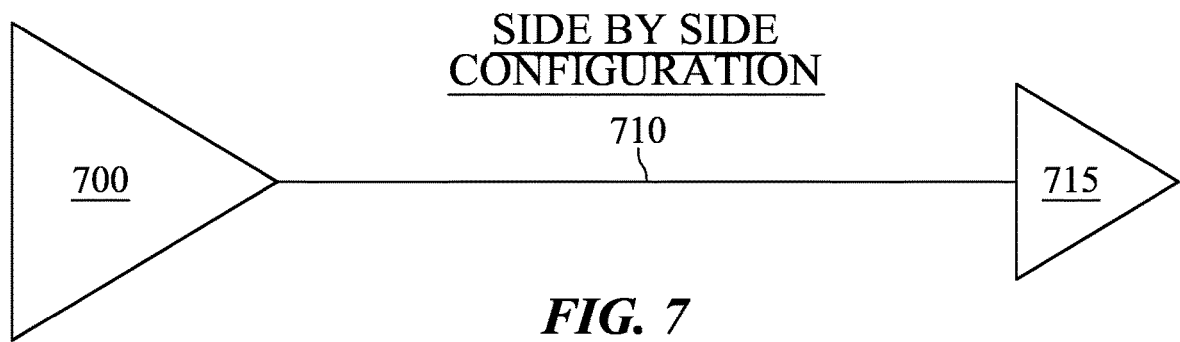
FIG. 7 is an illustration of a side by side configuration interconnect between two components.
Figure 8:
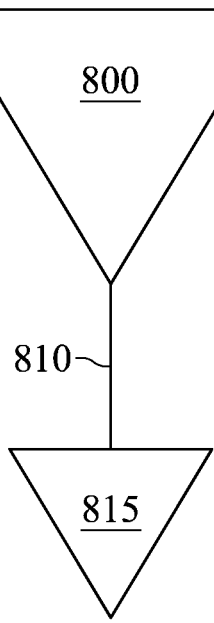
FIG. 8 is an illustration of a 3D interconnect configuration in accordance with embodiments.

Improved signal integrity achievable with the 3D interconnect configurations in accordance with embodiments is shown in the schematic illustrations of FIGS. 7-8.

FIG. 7 illustrates a side by side configuration interconnecting two components. The configuration shows a driver 700 (e.g., from die 550) for driving signals on an interconnect, a line length 710 of interconnect, and a chiplet 715 (e.g., component 510). In one example, the driver has a resistance of 25-200 ohms, line length is approximately 250-2,000 microns, and line resistance of approximately 20-100 ohms. The driver and line sizing are based on data rate, signal integrity of the lines, edge rate requirements, power delivery noise, input specifications of the receiver, and other characteristics of the driver and silicon interconnect.

FIG. 8 illustrates a 3D interconnect configuration in accordance with embodiments. The configuration shows a driver 800 (e.g., from die 650), a line length 810 of interconnect, and a chiplet 815 (e.g., chiplet 610). In one example, the driver 800 has a resistance of 200 ohms, line length is approximately 100-200 microns, and line resistance of approximately 1-10 ohms. The smaller line length and smaller driver resistance compared to a side by side configuration reduces the total capacitance, and therefore reduces the power. The significantly shorter line length causes lower power being needed, reduces cross-talk between components, reduces interconnect noise, reduces line loss, and capacitance decreases.

Figure 9:
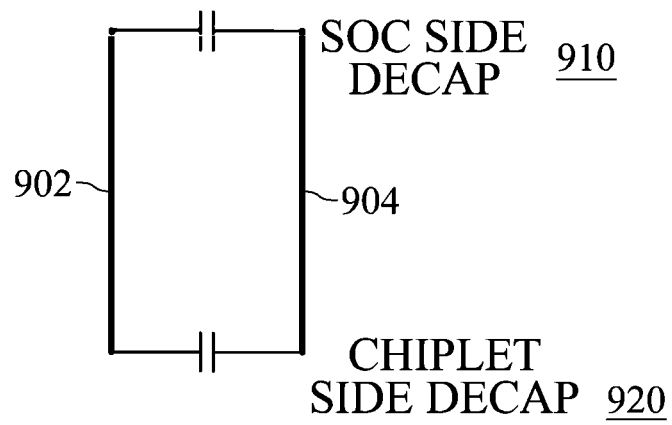
FIG. 9 is an illustration of a 3D interconnect configuration in accordance with embodiments.

As previously described, 3D interconnect structures in accordance with embodiments can include additional components, e.g. resistor, inductor, capacitor, etc. FIG. 9 illustrates a 3D interconnect configuration in accordance with embodiments including passive components. The configuration shows an SoC side decoupling capacitor 910, a chiplet side decoupling capacitor 920, a positive supply voltage 904 (e.g., Vdd), and a negative supply terminal 902 (e.g., Vss). Given a short interconnect routing to chiplet side, a finely distributed decoupling capacitor has an improved power integrity compared to a 2D interconnect configuration. The decoupling capacitors 910, 920 in accordance with embodiments may be included with the 3D interconnect structures, for example, within the package RDL and/or chiplet(s).

Up until this point various embodiments have been described and illustrated which point out various benefits of locating a 3D interconnect structure directly underneath a die (e.g., SoC). For example, this 3D interconnect structure includes a portion of the package RDL and/or chiplet. Such chiplet locations, however, can take up available pad area to the circuit board to which the package is attached, which can lead to blockage of available power delivery network (PND) area.

FIG. 10A illustrates a cross-sectional side view illustration of a chiplet in accordance with an embodiment. The chiplet 1000 (e.g., memory, logic, etc.) can be positioned partially below or underneath a die (e.g., SoC 350, 450, 650, 1150, 1350). In one example, the chiplet 1000 can be surface mounted with micro-bumps (μbump) 1042 to a redistribution layer (e.g., 440, 1140, 1240, 1340). The chiplet 1000 has an inner IO region 1001. This 10 region 1001 can be used for the 3D interconnect structure for power delivery to the die. FIG. 6 also illustrates chiplets with inner IO regions 612 and 614. The non-shaded area of the chiplet 1000 may be used for other signal connections to the package RDL. As shown, this non-shaded area can result in a shadow over the PCB which blocks the available PDN area for the system. This PDN shadowing can be reduced using stacked chiplet arrangements such as those illustrated in FIGS. 10B-10C.

FIGS. 10B-10C are cross-sectional side view illustrations of stacked chiplets in accordance with embodiments. The stacked chiplets 1020, 1030 (e.g., memory, logic, PMU, etc.) can be positioned partially below or underneath a die (e.g., SoC 350, 450, 650, 1250, 1350). The stacked chiplets 1020 have inner IO regions 1021. The stacked chiplets 1030 have an upper IO region 1031. The stacked chiplets 1020, 1030 can be constructed using μbump, wafer on wafer (WoW) or chip on wafer (CoW). In one example, the stacked chiplets 1020, 1030 can be surface mounted with micro-bumps 1042 to the redistribution layer (e.g., 440, 1140, 1240, 1340).

The stacked chiplets 1020 and 1030 have improved power delivery networks (for SoC side) in comparison to the chiplet 1000 and this lowers energy consumed due to less routing distance for the SoC power delivery. In general, logic chiplets can be chosen such that they have lower power (less PDN requirements) and thermal requirements, supportable by stacked configuration. The smaller stacked chiplets as illustrated in FIGS. 10B and 10C help to reduce chiplet warpage and therefore avoid thicker silicon due to keeping Z height less than solder ball height (e.g., bumps 360, FIG. 3B).

These smaller stacked chiplets have more attach options (e.g., self aligned solder as opposed to thermo compression bond), reduce bump pitch due to smaller amount of solder being required, and can be positioned in more suitable areas that meet power delivery and temperature criteria. The smaller chiplets may reduce electrostatic discharge (ESD) charge device model (CDM) charging and this can allow smaller ESD structures, which reduces area and pad capacitance.

Figure 15:
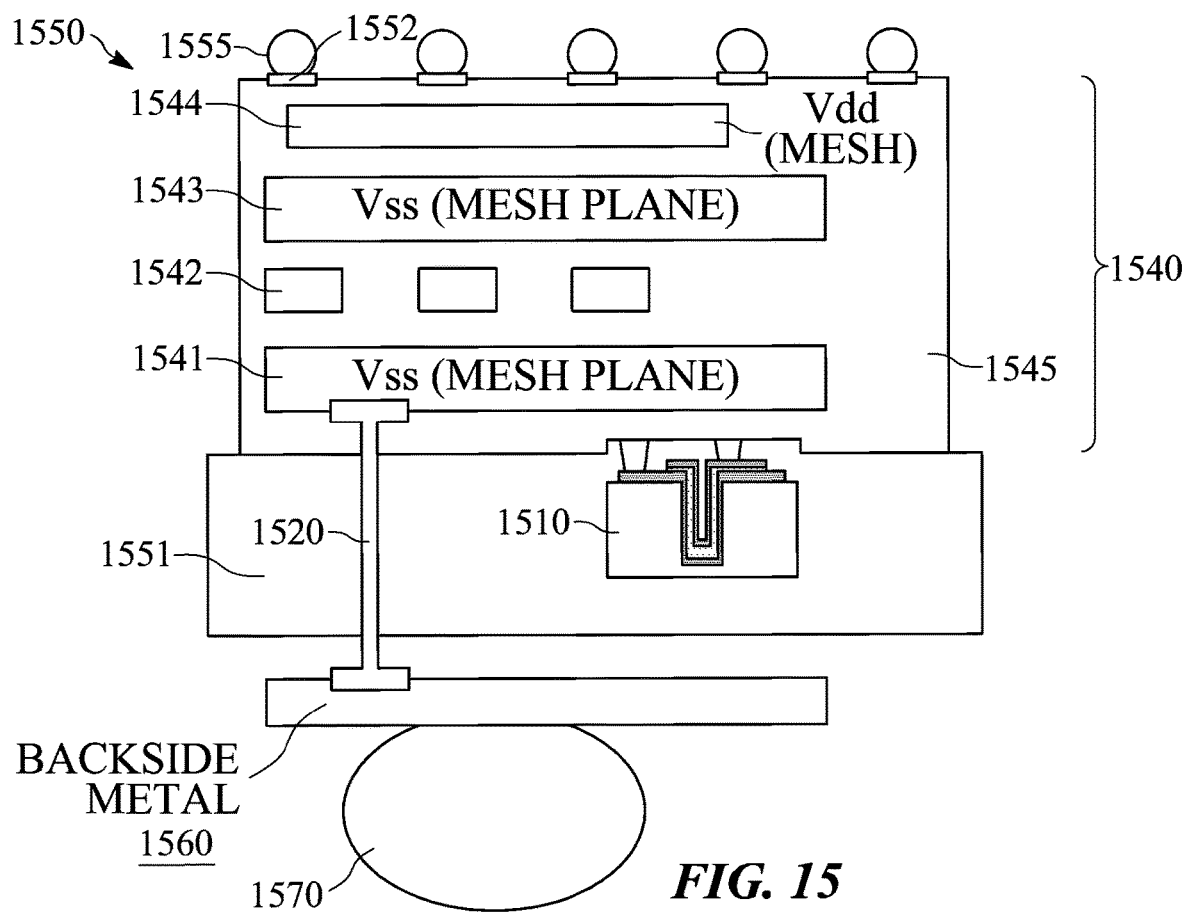
FIG. 15 is a cross-sectional side view illustration of a chiplet including a 3D interconnect structure in accordance with an embodiment.
Figure 16:
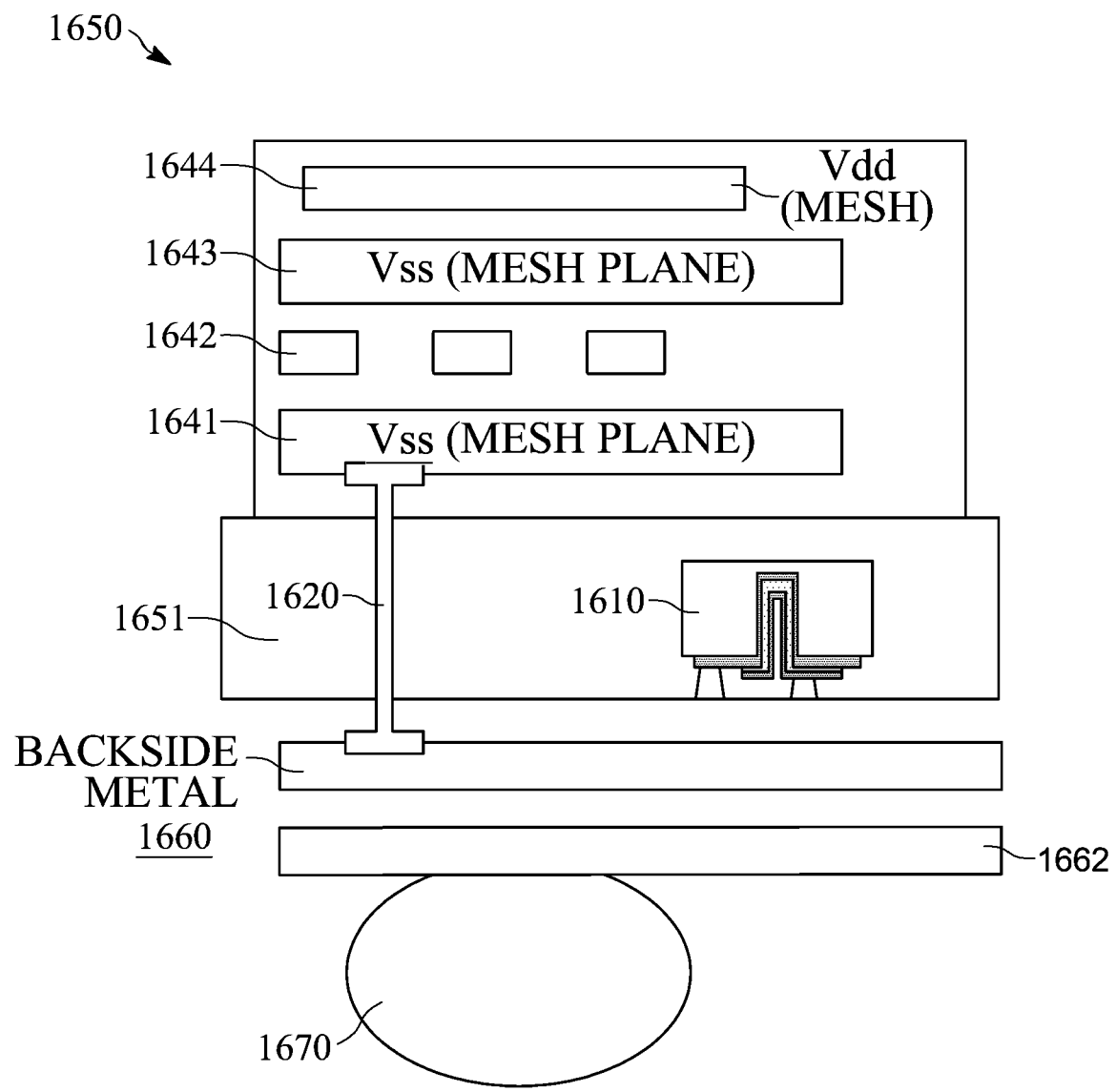
FIG. 16 is a cross-sectional side view illustration of a chiplet including a 3D interconnect structure in accordance with an embodiment.

Referring now to FIG. 11, a cross-sectional side view illustration is provided of a multi-component package including a chiplet in accordance with an embodiment. The chiplet 1110 (e.g., memory, logic, PMU) can be positioned partially below or underneath the die 1150 (e.g., SoC) for the package 1100. The die 1150 includes high performance logic 1152 and low performance logic 1154. In the illustrated embodiment, the chiplet 1110 is micro-bumped to the RDL 1140, though other methods of connection are possible, or the chiplet 1110 may be embedded in the RDL 1140. The RDL 1140 includes redistribution lines 1111-1113, passivation layers (e.g., passivation layer 1145), vias, and contact pads. The RDL 1140 has a first side 1148 and a second side 1149. A plurality of conductive bumps (e.g. solder bumps, μbumps, C4) are bonded to contact pads or conductive pillars of the RDL 1140 and also bonded to the circuit board 1102 to route signals to the die and the chiplet. In one example, bumps 1160 and 1163 provide electrical connections for negative supply terminals (e.g., Vss), bumps 1161 and 1164 provide electrical connections for positive supply voltage (e.g., Vdd) for the SoC, and bump 1162 provides an electrical connection for positive supply voltage (e.g., Vdd) for the chiplet 1110. Bumps 1160, 1161, 1162, 1163, 1164 can be bonded to corresponding landing pads 1170 on the circuit board 1102. An integrated passive device 1180 (e.g., resistor, inductor, capacitor, etc.) may also be positioned near the die 1150. 3D interconnects 1158 between die 1150 and chiplet 1110 minimizes a routing distance between the die 1150 and the chiplet 1110. The 3D interconnects 1158 may include a variety of structures including power bars, power planes, meshes, stacked vias, pillars, and other structures. For example, the device 1180 may be an active device (e.g., memory, logic), and a chiplet (e.g., chiplet 1110) may provide a connection between SoC 1150 and device 1180. In another example, the back side of chiplet 1110 can be electrically connected to the circuit board 1102 (e.g. with conductive bumps 1570, 1670 as shown in FIGS. 15-16) or to other routing (e.g. within package RDL, FIG. 3C).

Referring now to FIG. 12, a cross-sectional side view illustration is provided of a multi-component package including a stacked chiplet in accordance with an embodiment. The stacked chiplet 1210 (e.g., memory, logic) can be positioned partially below or underneath the die 1250 for the package 1200. The stacking reduces the die-shadow for the power distribution network on the main die (e.g., SoC), allowing easier power integrity integration. Also, the chiplet may need to have lower power density, so its own power delivery network (PDN) is manageable. The die 1250 includes high performance logic 1252 and low performance logic 1254. In one example, the stacked chiplet 1210 is surface mounted to the RDL 1240 using micro-bumps, though other methods of connection are possible, or the chiplet 1110 may be embedded in the RDL 1240. The RDL 1240 includes redistribution lines 1211-1213 and passivation layers (e.g., passivation layer 1245). The RDL 1240 has a first side 1248 and a second side 1249. A plurality of conductive bumps (e.g. solder bumps, C4) are bonded to contact pads or conductive pillars of the RDL 1240 and also bonded to the circuit board 1202 to route signals to the SoC and the chiplet. In one example, bumps 1260 and 1263 provide electrical connections for negative supply terminals (e.g., Vss), bumps 1261 and 1264 provide electrical connections for positive supply voltage (e.g., Vdd) for the SoC, and bump 1262 provides an electrical connection for positive supply voltage (e.g., Vdd) for the chiplet 1210. An integrated passive device 1280 (e.g., resistor, inductor, capacitor, etc.) may also be positioned near the die 1250. 3D interconnects 1258 between die 1250 and chiplet 1210 minimizes a routing distance between the die 1250 and the chiplet 1210. The 3D interconnects 1258 may include a variety of structures including power bars, power planes, meshes, stacked vias, pillars, and other structures. Additional bumps 1265 and 1266 may also be included in this package 1200 as a result of the reduced shadow of the chiplet 1210. These bumps 1265, 1266 can optionally be used for additional power delivery. Bumps 1260, 1261, 1262, 1263, 1264, 1265, 1266 can be bonded to corresponding landing pads 1270 on the circuit bar 1202. For example, device 1280 may be an active device (e.g., memory, logic), and a chiplet (e.g., chiplet 1210) may provide a connection between SoC 1250 and device 1280. In another example, the chiplet 1210 can be electrically connected to the circuit board 1202 (e.g. with conductive bumps 1570, 1670 as shown in FIGS. 15-16) or to other routing (e.g. within package RDL, FIG. 3C).

Figure 13A:
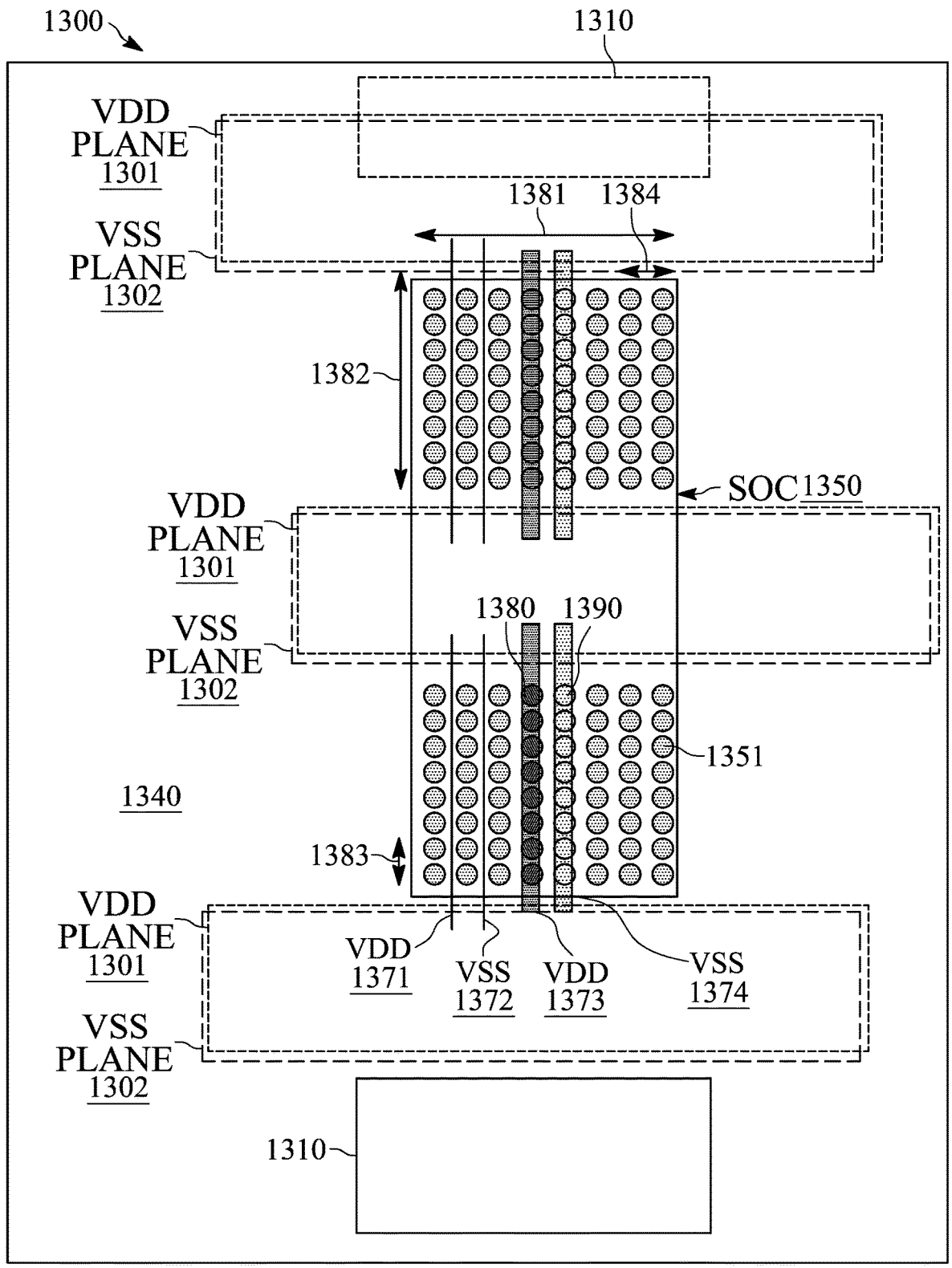
FIG. 13A is a top down 2D view of a multi-component package with a 3D interconnect configuration in accordance with embodiments.

Referring now to FIG. 13A, a top down 2D view is provided of a multi-component package 1300 with a 3D interconnect configuration in accordance with embodiments. As shown, the package RDL 1340 includes a Vdd positive supply plane 1301, Vss negative supply plane 1302, and other redistribution lines for signal routing. Also illustrated in the 3D interconnect structure are Vdd lines 1371, and Vss lines 1372. These Vdd lines 1371 and Vss lines 1372 can be run laterally between (and below) contact pads 1351 for various connections to the die 1350 including signal delivery, Vdd, Vss, etc. Thus, the illustrated contact pads 1351 are on the top side of the RDL 1340 for connection with the die 1350.

In an embodiment, the package RDL 1340 includes contact pads 1380 and 1390 for Vdd and Vss, respectively. In the illustrated embodiment, contact pads 1380, 1390 are arranged in rows or columns in order to improve power delivery to the die 1350 (e.g. SoC). Thus, the illustrated contact pads 1380, 1390 in FIG. 13A are on the top side of the RDL 1340 for connection with the die 1350. The contact pads 1380, 1390 can be arranged directly over (e.g. partially or fully), and in electrical contact with, Vdd power bar 1373 and Vss power bar 1374, respectively, within the package RDL 1340.

The 3D interconnect structures in accordance with embodiments can allow an increased contact pad density by locating the power bars directly underneath (e.g. partially or fully) the contact pads, and grouping of contact pads together based on function. In one example, the pads are arranged in an array having features including a width 1381, a length 1382, a first pad pitch 1384, and a second pad pitch 1383. These features may range from ten microns to a few hundred microns. The pads in the array can each have similar dimensions or the pads for power delivery can have larger dimensions compared to non-power pads. In this example, the array has 64 signals, Vdd pads, and Vss pads. In a specific example, a first pad pitch 1384 is 10-30 microns and a second pad pitch 1383 is 10-30 microns to provide a high IO density.

The chiplet 1310 can be located in multiple positions as illustrated in FIG. 13A. For example, chiplet 1310 (solid line) can be located on top of the package RDL 1340 laterally adjacent to the die 1350. For example, chiplet 1310 (dotted line) can be located within or underneath RDL 1340. While chiplets 1310 are not illustrated as being directly underneath, or at least partially directly underneath the die 1350, it is understood in accordance with embodiments that the chiplets 1310 can be located, at least partially or fully, directly underneath the die 1350 to facilitate a shorter routing length of the 3D interconnect structure. In one example, the package 1300 has minimal SoC and chiplet routing due to the 3D interconnect configuration of the package. The chiplet 1310 may include passive or active devices.

Figure 13B:
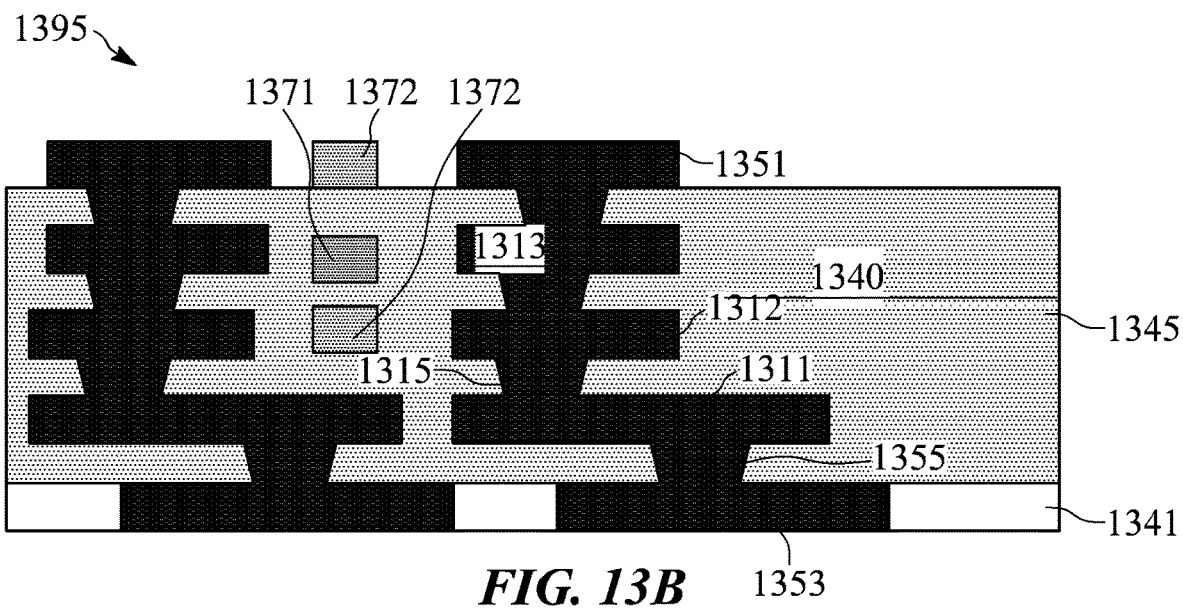
FIG. 13B is a cross-sectional view of a 3D interconnect structure including conductive traces in accordance with embodiments.

Referring now to FIG. 13B, a cross-sectional view is provided of a 3D interconnect structure including conductive traces in accordance with embodiments. In particular, the 3D interconnect structure of FIG. 13B includes Vdd lines 1371, Vss lines 1372 and contact pads 1351 shown in FIG. 13A.

The 3D interconnect structure 1395 is part of the RDL 1340 that may have one or more redistribution lines and passivation layers. RDL 1340 includes multiple redistribution lines 1311, 1312, 1313 and passivation layers 1345. In an embodiment, a first side of the RDL 1340 includes contact pads 1351, such as under bump metallurgy pads, for contact with die(s), and a second side of the RDL 1340 includes pads 1353 for contact with a chiplet(s) and/or PCB. In the embodiment illustrated, the RDL 1340 additionally includes a plurality of stacked vias 1315 and offset vias 1355. Stacking of vias supports the high density 3D interconnect. Vdd lines 1371 and Vss lines 1372 can be arranged between 3D interconnect traces used for delivery to various contact pads 1351.

Figure 13C:
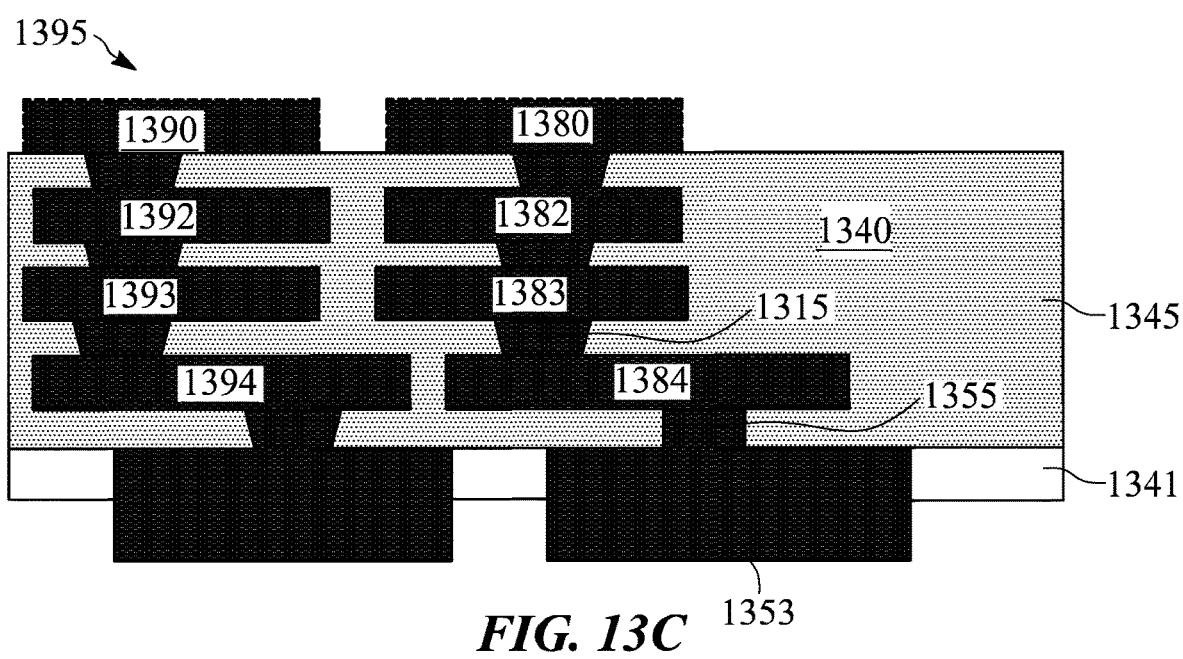
FIG. 13C is a cross-sectional view of a 3D interconnect structure including power bars in accordance with embodiments.

Referring now to FIG. 13C, a cross-sectional view is provided of a multi-component package with a 3D interconnect configuration including contact pads (e.g., 1380, 1390) and power bars 1373, 1374 of FIG. 13A in accordance with embodiments. The RDL power bars 1382-1384 correspond to the Vdd power bar 1373 of FIG. 13A, and the RDL power bars 1392-1394 correspond to the Vss power bar 1374 of FIG. 13A. Thus, the power bars may include metal lines in one or more metal layers, and may be stacked using landed or unlanded vias. These power bars include wide conductive metal lines having ample metal cross-section for small current (I) resistance (R) drops and sufficient electromigration margin. These power bars are illustrated as horizontal bars in FIG. 13C for improving power delivery to dies.

While Vss and Vdd power bar structures with stacked and unlanded vias are illustrated in FIGS. 13B-13C, it is understood that the 3D interconnect structures in accordance with embodiments can include power planes, meshes, stacked vias and other 3D interconnect structures for power and signal delivery.

A chiplet may also be used to connect two side by side die. Such interconnecting chiplets are shown in FIGS. 14, 15, 16 and 17. As previously described, the 3D interconnect structures, such as those illustrated in FIGS. 13A-13C within the package RDL 1340 can also, or alternatively, be provided within one or more chiplets. FIGS. 14-17 illustrate different chiplet configurations including a build-up layer 1440 that utilizes power mesh planes for power delivery to the chiplet. Similarly, the illustrated mesh planes can also be power bars as described with regard to FIGS. 13A-13C.

Figure 14:
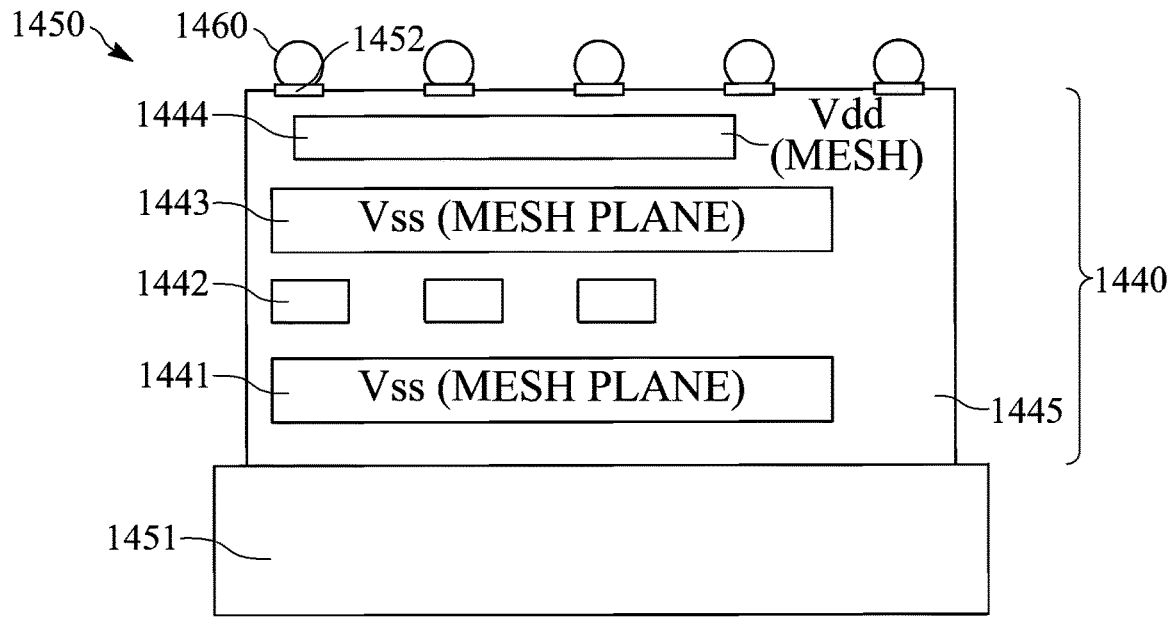
FIG. 14 is a cross-sectional side view illustration of a chiplet including a 3D interconnect structure in accordance with an embodiment.

FIG. 14 illustrates a cross-sectional side view of a chiplet having a build-up layer in accordance with an embodiment. The chiplet 1450 (e.g., silicon chiplet) can optionally be positioned partially below or underneath a die (e.g., SoC) as discussed in different embodiments herein. The build-up layer 1440 may be formed on a bulk silicon layer 1451. The build-up layer 1440 includes conductive lines (e.g., Vss mesh plane 1441, conductive signal lines 1442, Vss mesh plane 1443, Vdd mesh plane 1444) and passivation layers (e.g., passivation layer 1445). Such an arrangement is understood to be exemplary for illustrational purposes only, and embodiments may vary. The extra metal can help improve the PDN to the die, and increase routing between two dies (e.g., multi-die SoC configurations in side-by-side fashion where the chiplet 1450 acts as a bridge between the dies). The micro bumps 1460 will attach chiplet 1450 to the package RDL. In an embodiment, a top side of the chiplet 1450 includes contact pads 1452, onto which the micro bumps 1460 are attached. One or more contacts 1452 may be attached to the Vdd mesh planes, Vss mesh planes, or conductive signal lines. The Vdd, Vss mesh planes in the chiplet in turn may be electrically connected to one or more Vdd lines 1371, Vss lines 1372, Vdd power bars 1373, or Vss power bars 1374 within the package RDL 1340.

FIG. 15 illustrates a cross-sectional side view of a chiplet having a build-up layer in accordance with an embodiment. Chiplet 1550 includes build-up layer 1540 formed on a bulk silicon layer 1551, which may also include an integrated passive device 1510 (such as a capacitor, etc.) at least partially formed therein. The build-up layer 1540 includes conductive lines (e.g., Vss mesh plane 1541, conductive signal line 1542, Vss mesh plane 1543, Vdd mesh plane 1544) and passivation layers (e.g., passivation layer 1545). A through silicon via 1520 can optionally be formed to electrically couple a Vdd or Vss mesh plane to a backside metal layer 1560. Thus, the back side of the chiplet 1550 can include metal layer 1560 to increase the PDN, and metal volume. A conductive bump 1570 (e.g. solder bumps, C4) is bonded to the backside metal 1560 and may also be bonded to a circuit board to route signals and power to the build-up layer. Electrical connection with the conductive bump 1570 can improve the PDN significantly. It adds extra process steps, and may be considered optional. The micro bumps 1555 will attach chiplet 1550 to the package RDL. In an embodiment, a top side of the chiplet 1550 includes contact pads 1552, onto which the micro bumps 1555 are attached. One or more contacts 1552 may be attached to the Vdd mesh planes, Vss mesh planes, or conductive signal lines. The Vdd, Vss mesh planes in the chiplet in turn may be electrically connected to one or more Vdd lines 1371, Vss lines 1372, Vdd power bars 1373, or Vss power bars 1374 within the package RDL 1340.

Referring now to FIG. 16, a cross-sectional side view illustration is provided of a chiplet having a build-up layer in accordance with an embodiment. The chiplet 1650 (e.g., silicon chiplet with integrated passive device 1610) can be positioned partially below or underneath an SoC as discussed in different embodiments herein. The build-up layer 1640 can be formed on bulk silicon layer 1651, and include conductive lines (e.g., Vss mesh plane 1641, conductive signal line 1642, Vss mesh plane 1643, Vdd mesh plane 1644) and passivation layers (e.g., passivation layer 1645). A through silicon via 1620 electrically couples a Vdd or Vss mesh plane to a backside metal layer 1660. An additional backside metal layer 1662 may also be provided to improve power delivery and reduce warpage. Thus, the back side of the chiplet 1650 may include multiple metal layers to support the PDN. A conductive bump 1670 (e.g. solder bumps, C4) is optionally bonded to the backside metal layer 1662 and may also be bonded to a circuit board to route signals and power to the build-up layer.

Figure 17:
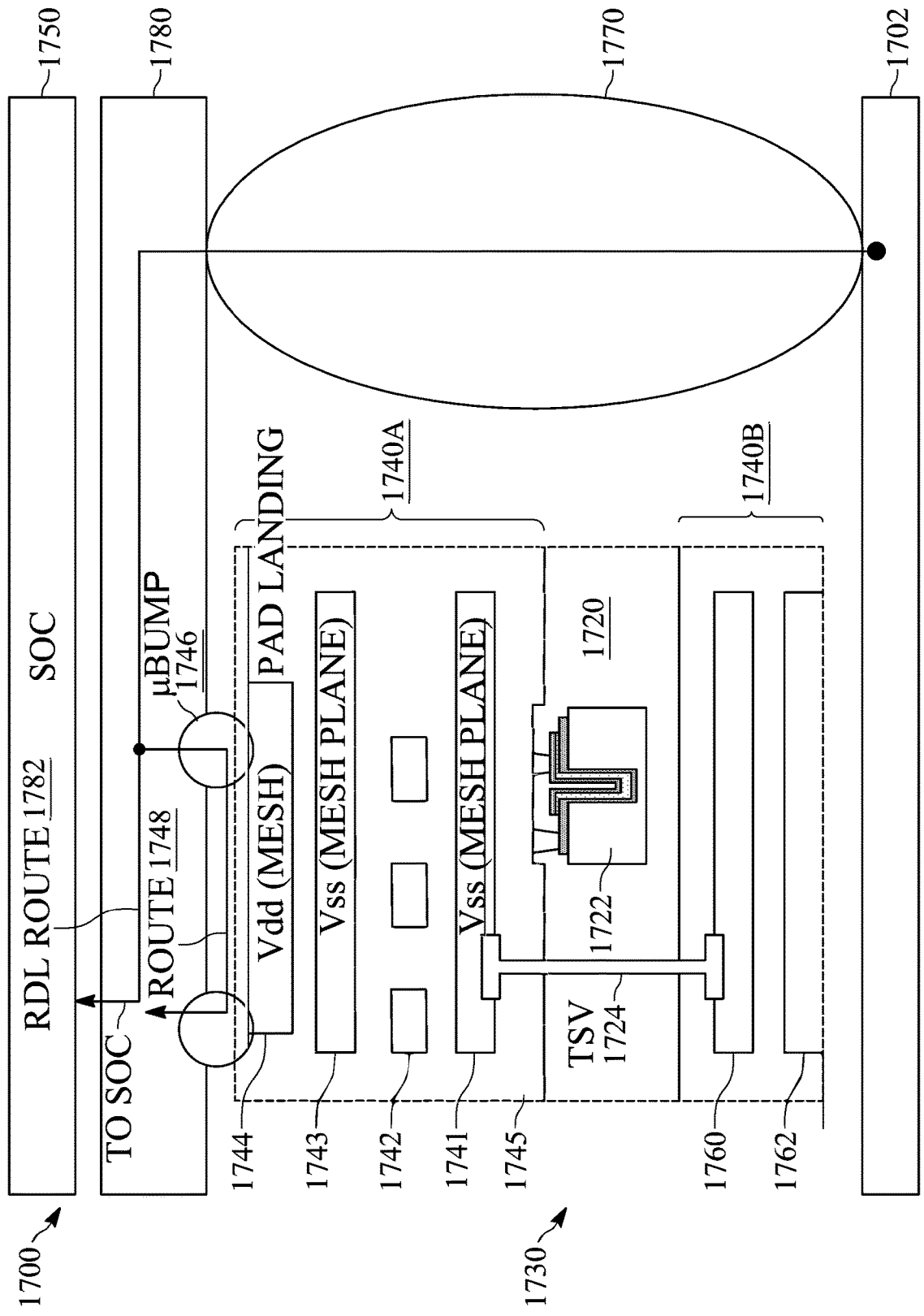
FIG. 17 is a cross-sectional side view illustration of a multi-component package in accordance with an embodiment.

Referring now to FIG. 17, a cross-sectional side view illustration is provided of a multi-component package in accordance with an embodiment. The package 1700 includes a die 1750 (e.g., SoC), package RDL 1780 with an exemplary RDL route 1782, a chiplet 1730 (dashed box) that includes build-up layers 1740a, 1740b, and a bulk silicon layer 1720 (which may optionally include an integrated passive device 1722 and TSV 1724). The chiplet 1730 can be positioned below or underneath the die 1750 as discussed in different embodiments herein. In one example, microbumps 1746 are bonded to the build-up 1740a and the package RDL 1780. The build-up layer 1740a includes conductive lines (e.g., Vss mesh plane 1741, conductive signal line 1742, Vss mesh plane 1743, Vdd mesh plane 1744 with exemplary local interconnect route 1748) and passivation layers (e.g., passivation layer 1745). A TSV 1724 electrically couples a Vdd or Vss mesh plane to a backside metal layer 1760. An optional additional backside metal layer 1762 may also be provided to improve power delivery (e.g., improve power plane resistance) and reduce warpage of the package. Conductive bumps 1770 (e.g. solder bumps, C4) can be bonded to the RDL 1780 and may also be bonded to a circuit board 1702 to route signals and power to the RDL 1780, which routes signals and power to the SoC 1750 and the build-up layer 1740a.

The build-up layer and chiplets discussed herein can have active repeaters to reduce line length between repeaters and increase edge rates. A design with active repeaters has smaller width and therefore smaller capacitances.

In one embodiment, an active build-up layer/chiplet includes a voltage regulator (VR). The VR can have a high voltage input and may be low-dropout (LDO) type or switch capacitor type depending on availability of capacitors.

In utilizing the various aspects of the embodiments, it would become apparent to one skilled in the art that combinations or variations of the above embodiments are possible for forming an electronic package and system with 3D interconnect structures for power delivery. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic system comprising:
a circuit board;
a die bonded to the circuit board with a plurality of solder bumps;
a chiplet directly underneath the die and laterally adjacent the plurality of solder bumps, wherein the chiplet includes:
a bulk silicon layer;
a plurality of trench capacitors in the bulk silicon layer, and a through silicon via through the bulk silicon layer;
a build-up layer including positive supply (Vdd) routing and negative supply (Vss) routing; and
a backside metal layer, wherein the back side metal layer is bonded to the circuit board with a conductive bump;
wherein the die is a system on chip (SoC) die that includes a low performance logic and a high performance logic, and the chiplet is substantially directly underneath the low performance logic.

2. The electronic system of claim 1, wherein the build-up layer includes a Vdd mesh plane.

3. The electronic system of claim 2, wherein the build-up layer includes a Vss mesh plane.

4. The electronic system of claim 1, further comprising micro bumps bonded to contacts on a top side of the chiplet.

5. The electronic system of claim 1, wherein the chiplet includes a voltage regulator.

6. The electronic system of claim 5, wherein the voltage regulator is a switch capacitor voltage regulator or low-dropout (LDO) voltage regulator.

7. The electronic system of claim 1, wherein the high performance logic is characterized by a power density that is at least twice a power density of the low performance logic.

8. The electronic system of claim 1, wherein the backside metal layer is part of a backside build-up layer.

9. The electronic system of claim 1, further comprising a redistribution layer (RDL) between the build-up layer and the die.

10. An electronic system comprising:
a circuit board;
a die bonded to the circuit board with a plurality of solder bumps;
a chiplet directly underneath the die and laterally adjacent the plurality of solder bumps, wherein the chiplet includes:
a bulk silicon layer;
a plurality of trench capacitors in the bulk silicon layer, and a through silicon via through the bulk silicon layer;
a build-up layer including positive supply (Vdd) routing and negative supply (Vss) routing; and
a backside metal layer, wherein the back side metal layer is bonded to the circuit board with a conductive bump; and
a redistribution layer (RDL) between the build-up layer and the die, wherein the RDL includes coarser pitch routing than the build-up layer.

11. The electronic system of claim 10, wherein the RDL includes a power bar to provide a positive power supply to the die.

12. The electronic system of claim 11, wherein the RDL includes a second power bar to provide a negative power supply to the die.

13. The electronic system of claim 11, wherein the power bar is directly underneath and in electrical contact with a plurality of contact pads of the die.

14. The electronic system of claim 10, wherein the RDL and chiplet include stacked vias.

15. The electronic system of claim 10, wherein the backside metal layer of the chiplet is bonded to the circuit board with a plurality of conductive bumps.

16. The electronic system of claim 15, wherein the circuit board includes a negative power supply (Vss) landing pad, a positive power supply (Vdd) landing pad, and a plurality of signal landing pads.

17. The electronic system of claim 16, wherein the plurality of conductive bumps includes a first conductive bump bonded to the Vss landing pad, and a second conductive bump bonded to the Vdd landing pad.

18. The electronic system of claim 17, wherein the plurality of conductive pumps includes a third conductive bump bonded to one of the plurality of signal landing pads.

19. The electronic system of claim 10, wherein the backside metal layer is part of a backside build-up layer.

20. The electronic system of claim 10, wherein the chiplet includes a voltage regulator.

* * * * *